United States Patent
Raza et al.

(10) Patent No.: US 6,510,487 B1
(45) Date of Patent: Jan. 21, 2003

(54) DESIGN ARCHITECTURE FOR A PARALLEL AND SERIAL PROGRAMMING INTERFACE

(75) Inventors: S. Babar Raza, Sunnyvale, CA (US); Anita X. Meng, Milpitas, CA (US); Donald A. Krall, Cuportino, CA (US); Khaldoon S. Abugharbieh, Sunnyvale, CA (US); Roger J. Bettman, Los Altos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 1033 days.

(21) Appl. No.: 08/592,868

(22) Filed: Jan. 24, 1996

(51) Int. Cl.[7] .................................... G06F 13/00
(52) U.S. Cl. .................. 711/100; 711/211; 365/189.02; 365/220; 365/221; 710/51; 710/62; 710/305
(58) Field of Search .................. 395/800, 430, 395/436, 497.01, 871, 882, 883, 891–892, 102–104, 109, 114; 326/38–40; 365/189.02, 189.12, 220, 221, 230.02; 710/38, 51, 62, 72–74, 8, 14, 36, 315, 316; 711/1, 100–101, 154, 170, 211

(56) References Cited

U.S. PATENT DOCUMENTS

| | | | | |
|---|---|---|---|---|
| 4,402,067 A | * | 8/1983 | Moss et al. .................. 365/219 |
| 4,964,124 A | * | 10/1990 | Burnett ....................... 371/15.1 |
| 5,282,164 A | * | 1/1994 | Kawana .................. 365/189.12 |

* cited by examiner

Primary Examiner—Matthew Kim
Assistant Examiner—Denise Tran
(74) Attorney, Agent, or Firm—Christopher P. Maiorana, P.C.

(57) ABSTRACT

The present invention provides an integrated parallel and serial programming interface that can be selected between either a parallel programming mode or a serial programming mode. The present invention provides a control logic circuit for selecting between the parallel and serial modes. The present invention also includes a parallel and serial detection circuit. The control logic sends a signal to an interface circuit that selects between a serial programming mode and a parallel programming mode based on the outputs of the parallel and serial detection circuits.

10 Claims, 4 Drawing Sheets

DESIGN ARCHITECTURE FOR A PARALLEL AND SERIAL PROGRAMMING INTERFACE

FIELD OF THE INVENTION

The present invention relates generally to the programming of programmable logic devices and more particularly to the programming of programmable logic devices using an interface that operates in either a parallel or a serial control.

BACKGROUND OF THE INVENTION

A programmable logic device (PLD) provides an economical and efficient means for implementing predetermined boolean logic functions. Such a device typically consists of a group of programmable AND gates responsive to a plurality of inputs used to generate a number of predetermined product terms. A typical PLD also comprises a group of fixed/programmable OR gates responsive to the product terms for generating a plurality of sum-of-product (SOP) terms and a macrocell responsive to the sum-of-product terms for generating a desired output.

Typically when designing a programmable logic device, a design engineer must choose between either a parallel programming architecture or a serial programming architecture.

FIG. 1 illustrates a typical prior art parallel programming architecture for a PLD. The parallel architecture 10 generally comprises a set of input buffers 12, a program control detect block 14, a set of address inputs 16, a set of data inputs 18, a set of mode instruction inputs 20, a program control block 22 and an array of programmable elements 24. The address inputs 16, the data inputs 18 and the mode instruction inputs 20 can be registers or merely pins. The input buffers 12 receive a group of parallel inputs at an input 26. The input buffers 12 have a bus 15 that is connected to the address inputs 16, a bus 17 that is connected to the data inputs 18, a bus 19 that is connected to the mode instruction inputs 20 and a bus 21 that is connected to the program control block 22. The program control detect block 14 receives a set of control signals at an input 28. The program control detect block 14 presents signals to the program control block 22 through a bus 23. The address inputs 16, the data inputs 18, the mode instruction inputs 20 and the program control block 22 each have a bus 25, 27, 29 and 31 that is coupled to the array 24. The bus 27 connecting the data inputs 18 and the array 24 is typically a bidirectional bus.

Referring to FIG. 2 a typical prior art serial architecture 30 is shown. The serial architecture 30 is illustrated using primed reference numbers where similar blocks can be compared to the parallel architecture 10 illustrated in FIG. 1. The input buffers 12' receive a serial input at an input 32 and present the serial input to the address inputs 16'. The address inputs 16', the data inputs 18', the mode instruction inputs 20' and the program control block 22' are all cascaded together serially through data lines 34, 36 and 38. The program control detect block 14 is replaced by a control select block 40 that receives a control signal at an input 42. The address inputs 16', the data inputs 18', the mode instruction inputs 20' and the program control block 22' each have a bus that is coupled to the array 24'. It should be appreciated that the parallel architecture 10 illustrated in FIG. 1 does not have the cascaded data lines 34, 36 and 38 as required in the serial architecture 30.

It is therefore an object of the present invention to provide a circuit for providing both serial and parallel programming of a PLD (or CPLD). The present invention reduces the overall number of circuits required to be manufactured by providing a single universal circuit for either serial or parallel programming at the option of the user/programmer.

SUMMARY OF THE INVENTION

The present invention provides an integrated parallel and serial programming interface that can be selected by a user/programmer between either a parallel programming mode or a serial programming mode. The present invention provides a control logic circuit for selecting between the parallel and serial modes. The present invention also includes a parallel and serial detection circuit. The control logic sends a signal to an interface circuit that selects between a serial programming mode and a parallel programming mode based on the outputs of the parallel and serial detection circuits.

BRIEF DESCRIPTION OF THE DRAWINGS

These and other objects, features and advantages of the present invention will be apparent from the following detailed description and appended claims in which:

DETAILED DESCRIPTION OF THE PREFERRED EMBODIMENTS

Figure 1:
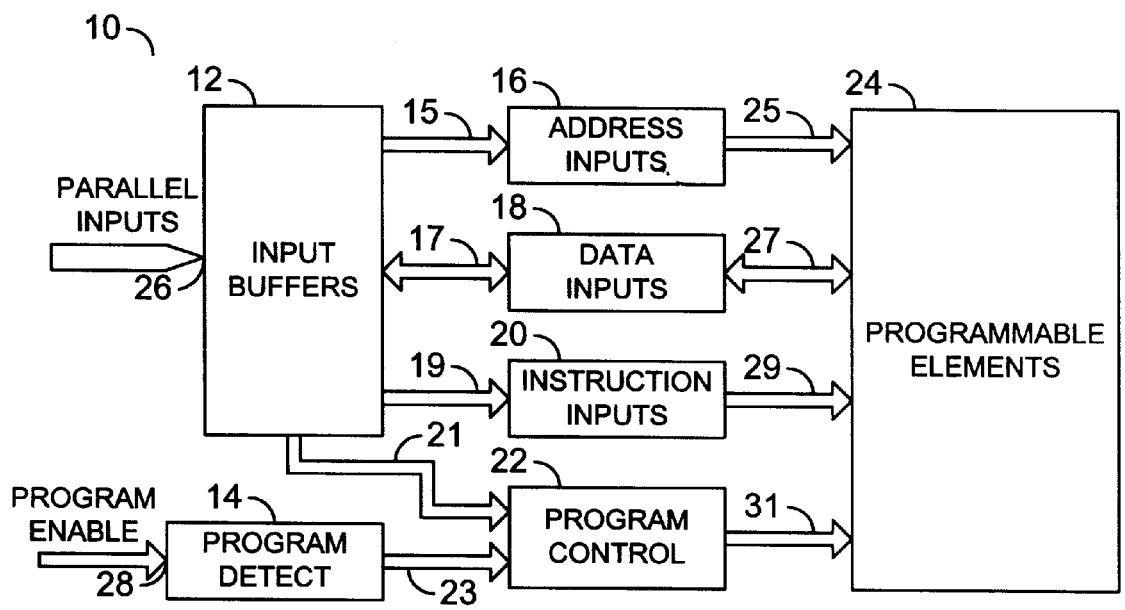
FIG. 1 is a block diagram of a prior art parallel programming scheme.
Figure 2:
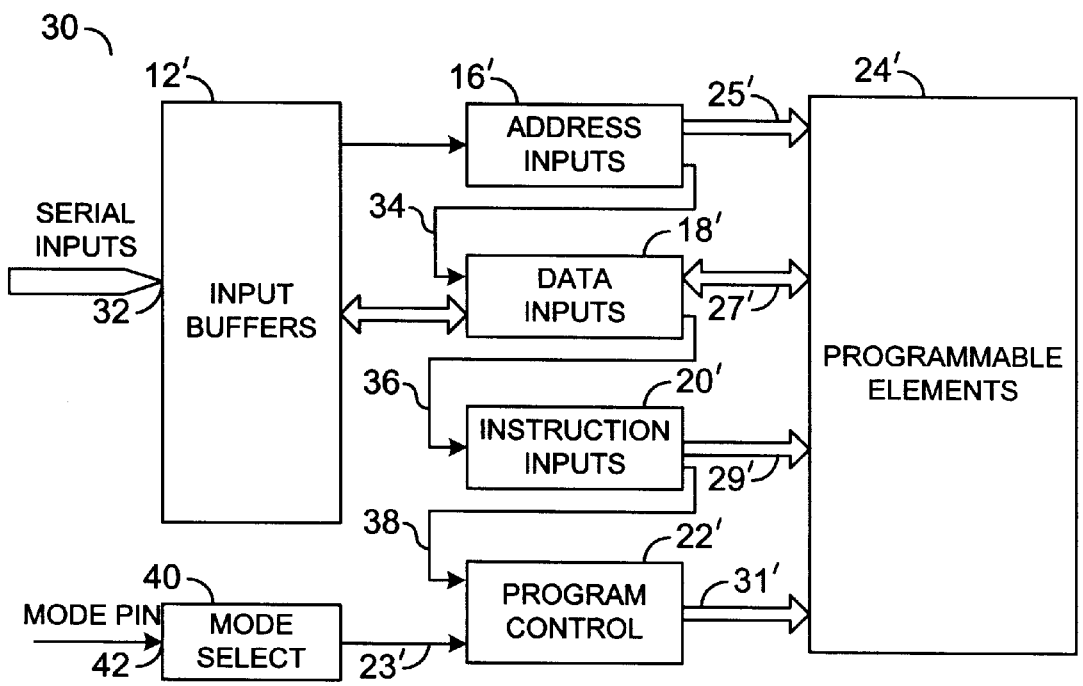
FIG. 2 is a block diagram of a prior art serial programming scheme.
Figure 3:
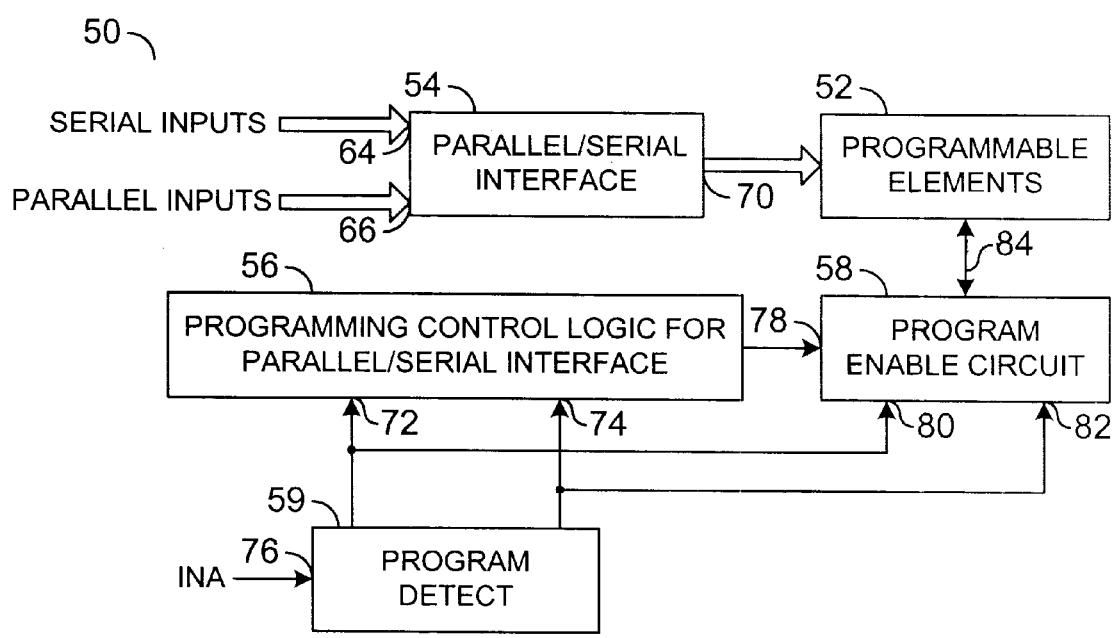
FIG. 3 is a block diagram of the overall architecture of the present invention.

Referring to FIG. 3, a device 50 illustrating the preferred embodiment of the present invention is shown. The device 50 comprises an array of programmable elements 52, a parallel/serial interface 54, a programmable control logic block 56, a program enable block 58, a program detect block 59. The parallel/serial interface 54 has a first input 64 for receiving serial input information, a parallel input 66 for receiving parallel input information and a logic input 68 that receives one or more control signals from the programming logic block 56. The parallel/serial interface 54 has an output bus 70 that presents information to the array 52. The information presented at the output bus 70 is derived from the serial input 64 or the parallel input 66 depending upon a control signal received at the logic input 68. The array 52 comprises an array of programming elements that can be a PLD, a CPLD, a programmable array logic (PAL) or any other appropriate array of programmable elements suitable for a particular application.

The programming control logic block 56 has an input 72 that receives a first signal from the program detect block 59 and an input 74 that receives a second signal from the program detect block 59. The programming control logic block 56 presents the signal to the logic input 68 in response to the signals received at the inputs 72 and 74. The logic implemented in the programming control logic block 56 will be described in more detail with respect to TABLE 1 and TABLE 2. The program detect block 59 has an input 76 that receives a configuration signal INA. The program detect block 59 works in combination with the programming control logic block 56 to present the control signal at the logic input 68. It should be appreciated that the configuration signal INA can be one or more separate signals.

The program enable circuit 58 has an input 79 that receives a signal from the programming control logic block 56, an input 80 that receives a signal from the program detect block 59 and an input 82 that also receives a signal from the program detect block 59. The program enable circuit 58 is coupled to the array 52 through one or more control lines 84. The program enable circuit 56 presents a memory enable signal to the array 52 when the program detect block 59 presents an output.

In one example, the configuration signal INA is divided into two configuration signals INA and INB that each respond to the design criteria of a particular application to provide either a serial or a parallel functioning of the parallel/serial interface 54. If a serial interface is desired, a particular combination of the configuration signal INA and the configuration signal INB will be present. Similarly, if a parallel configuration of the device 50 is desired, a different combination of the configuration signal INA and the configuration signal INB will be present. The various combinations of the configuration signal INA and the configuration signal INB will be described in more detail with respect to TABLE 1 and TABLE 2.

A preferred method for implementing the program detect block 59 is to present the two independent configuration signals INA and INB to the program detect block 59. When the configuration signal INA is high and the configuration signal INB is low, the program detect block 59 will present a serial control detect signal at the input 72 of the programming control logic block 56. Next, the programming control logic block 56 will present a signal to the logic input 68 of the parallel/serial interface 54. As a result, the device 50 will function in a serial mode and receive only serial input signals at the serial input 64. Similarly, if the INB signal is high and the INA signal is low, the program detect block 59 will present a parallel control detect signal at the input 74 of the programming control logic block 56. As a result, the programming control logic block 56 will present a signal to the logic input 68 indicating the device 50 will operate in a parallel mode. As a result, the device 50 will only present a parallel output at the output 70 when the device 50 receives parallel inputs at the parallel input 66. The logic described is illustrated in the following TABLE 1:

TABLE 1

|  | INA | INB |
| --- | --- | --- |
| Serial | 1 | 0 |
| Parallel | 0 | 1 |

An alternate method for implementing the program detect block 59 would be to have a parallel control signal presented at input 74 of the programming control logic block 56 when both the INA signal and the INB signal are high. If only one of the inputs INA or INB is high, the serial program detect block 60 will present a serial control signal at the input 72 of the programming control logic block 56. This logic is illustrated by the following TABLE 2:

TABLE 2

|  | INA | INB |
| --- | --- | --- |
| Parallel | 1 | 1 |
| Serial | 0 | 1 |
| Serial | 1 | 0 |

It should be appreciated that the specific logic illustrated in TABLE 1 and TABLE 2 is for illustrative purposes only. Other logic implementations could be substituted without departing from the spirit of the present invention. Particularly, in TABLE 1, the states of the input signals INA and INB could be inverted for both the serial and parallel programming functions. In another example, if opposite polarity is used, the parallel control could be enabled when both the signals INA and INB are low as opposed to high. Other such implementations could be realized to adjust the circuit to fit the design criteria of a particular application.

Another method for implementing the program detect block 59 would be to use only one configuration signal, for example, INA. When a digital high value is detected on the single configuration signal INA, the program control is enabled and a signal is sent to the programming control logic 56. In this implementation, two sets of instructions would be needed as part of the configuration signal INA to distinguish between a parallel and a serial mode of operation. This implementation would provide the advantage of requiring less inputs, specifically only a single configuration signal INA. The disadvantage would be that it would require the additional instruction. Additionally, a single input that has two different level detect circuits could be used to distinguish between serial and parallel configurations. The different voltage detects could be Vcc (power supply voltage) and Vcc/2 or super voltages (i.e. greater than Vcc).

Figure 4:
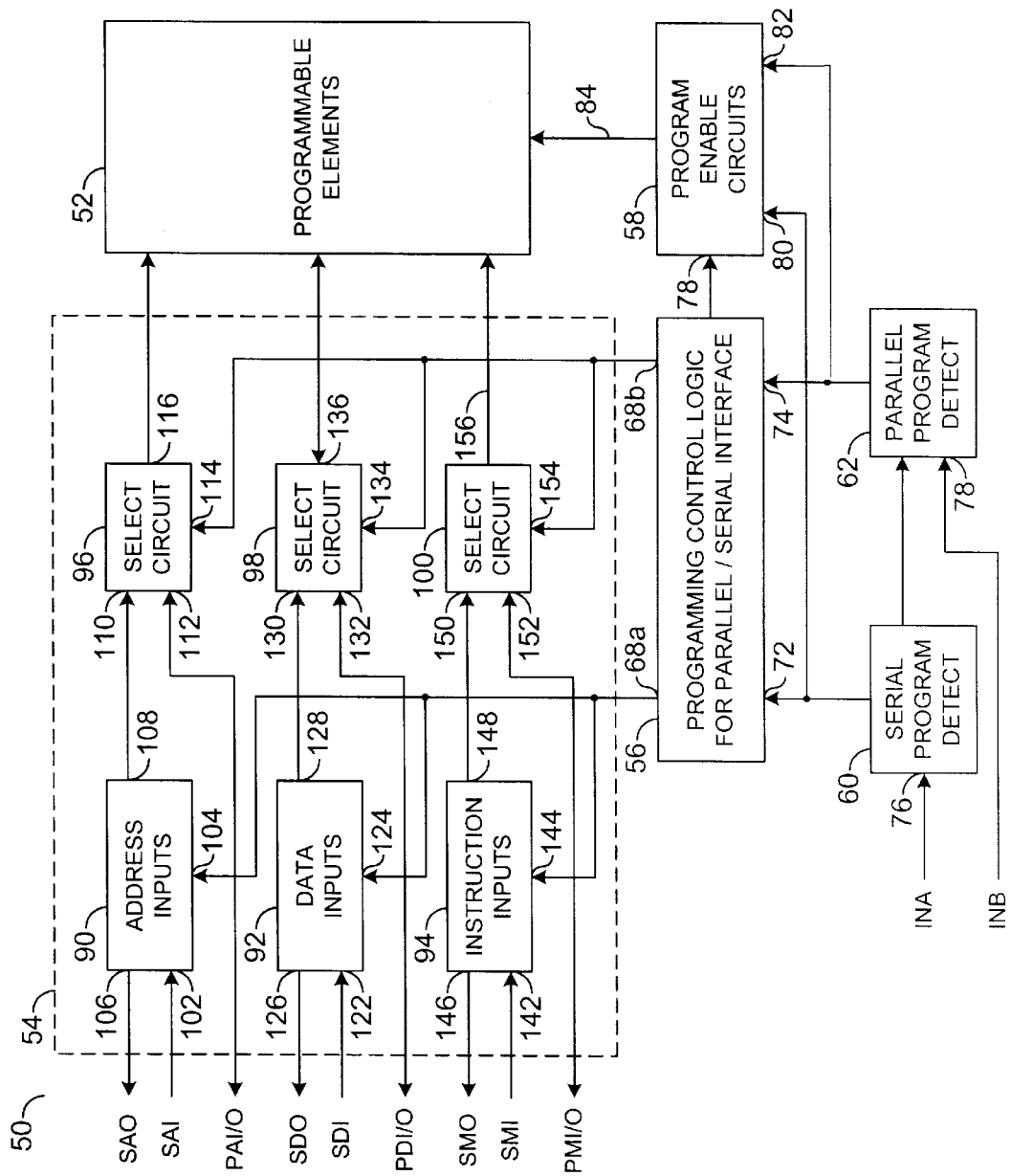
FIG. 4 is a more detailed block diagram of a parallel/serial programmable device in accordance with a presently preferred embodiment of the present invention.

Referring to FIG. 4, a more detailed block diagram of the device 50 is shown. Specifically the parallel/serial interface 54, the serial input 64 and the parallel input 66 are shown in greater detail. The program detect block 59 is shown as a serial program detect block 60 and a parallel detect block 62. The serial program detect block 60 receives the configuration signal INA at the input 76. The parallel program detect block 62 receives a configuration signal INB at an input 78. The parallel input 66 is shown as a parallel input PAI/O, a parallel input PDI/O and a parallel input PMI/O. The serial input 64 is implemented as a serial input SAI, a serial input SDI and a serial input SMI. A group of serial outputs are implemented as a serial output SAO, a serial output SDO and a serial output SMO. The serial inputs SAI, SDI and SMI could be serially connected together to shift information through a single input. Similarly, the serial outputs SAO, SDO and SMO could be serially connected together to shift output data through a single output. The parallel inputs PAI/O, PDI/O and PMI/O could be from one to n bits wide.

The parallel/serial interface 54 comprises an address input block 90, a data input block 92 and a instruction input block 94. The parallel/serial interface 54 also comprises a select circuit 96, a select circuit 98 and a select circuit 100. The address input block 90 receives an input 102 from the serial input SAI, an input 104 from a logic input 68a of the programming control logic block 56 and presents an output 106 representing the serial output SAO. The address input block 90 also presents an output 108 to a first input 110 of the select circuit 96. The select circuit 96 also receives a second input 112 from the parallel input PAI/O. The select circuit 96 also receives an input 114 from a logic input 68b of the programming control logic block 56. The signal received at the input 114 provides information that the select circuit 96 uses to switch between either the input 110 or the input 112 to present an output 116.

The data input block 92 receives an input 122 from the serial input SDI, an input 124 from the logic input 68a of the programming control logic block 56 and presents an output 126 representing the serial output SDO and an output 128 that is presented to a first input 130 of the select circuit 98. The select circuit 98 also receives a second input 132 from the parallel input PDI/O. The select circuit 98 also receives an input 134 from the logic input 68b of the programming control logic block 56. The signal received at the input 134 provides information that the select circuit 98 uses to switch between either the input 130 or the input 132 to present an output 136.

The instruction input block 94 receives an input 142 from the serial input SMI, an input 144 from the logic input 68a of the programming control logic block 56 and presents an output 146 representing the serial output SMO and an output 148 that is presented to a first input 150 of the select circuit 100. The select circuit 100 also receives a second input 152 from the parallel input PMI/O. The select circuit 100 also receives an input 154 from the logic input 68b of the programming control logic block 56. The signal received at the input 154 provides information that the select circuit 100 uses to switch between either the input 150 or the input 152 to present an output 156. The logic inputs 68a and 68b can be implemented as separate inputs, as shown in FIG. 4, or as a single input having multiple states. A single logic input having multiple states would operate similarly to the method for implementing the serial program detect block 60 using a single signal having two sets of instructions.

Figure 5:
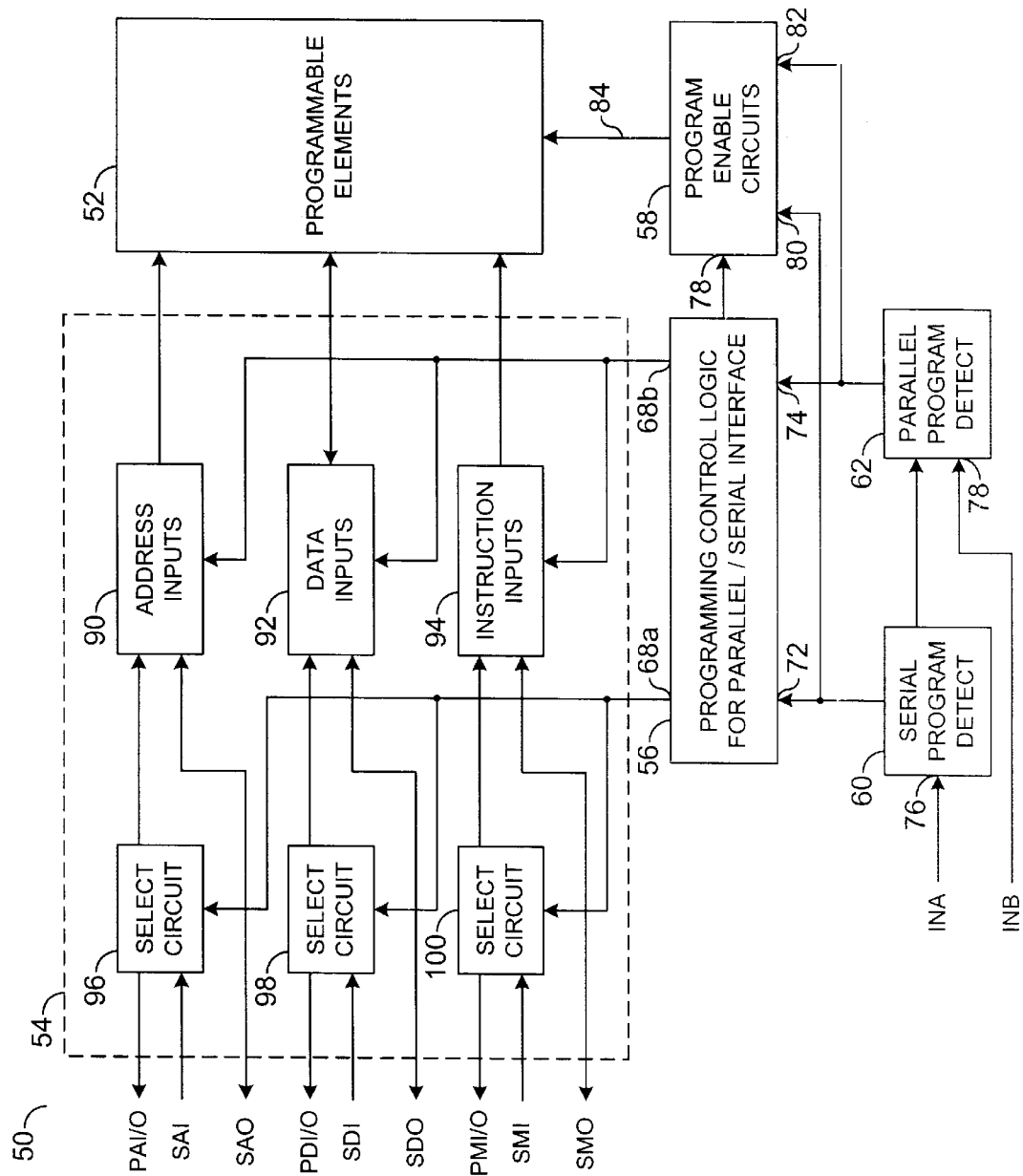
FIG. 5 is an alternative embodiment of the present invention.

Referring to FIG. 5, an alternate block diagram illustrating the device 50 is shown. Specifically, the parallel/serial interface 54 is modified so that the select circuits 96, 98 and 100 are placed before the address input block 90, the data input block 92 and the instruction input block 94. The parallel/serial interface 54 illustrated in FIG. 5 functions identically to the parallel/serial interface 54 illustrated in FIG. 4.

The present invention has been described in connection with a programmable parallel/serial interface 54 that switches between a serial input 64 and a parallel input 66. It should be appreciated that the present invention may be expanded to select between any two input protocols. For example, the parallel/interface circuit 54 could be adapted to select between a parallel input 66 and a proprietary input protocol such as a combination of serial and parallel signals or a multiple cycle parallel loading. Additionally, the serial program detect block 60 and the parallel program detect block 62 may be implemented in any way that provides the result of selecting between a first programming protocol and a second programming protocol.

It is to be understood that modifications to the invention might occur to one with skill in the field of the invention within the scope of the appended claims.

What is claimed is:

1. A circuit comprising:
   an interface circuit having (i) a serial input, (ii) a parallel input distinct from said serial input and (iii) an interface output, said interface circuit configured to present either said serial input or said parallel input at said interface output in response to one or more control signals;
   a logic circuit configured to present said one or more control signals in response to an enable signal; and
   a memory array having a data input for receiving said signals from said interface output.

2. The circuit according to claim 1 wherein said logic circuit further comprises:
   a detection circuit configured to receive a configuration signal having a plurality of configuration instructions, said detection circuit configured to present said enable signal at a first state when a particular one of said configuration instructions is present and at a second state when another one of said configuration instructions is present.

3. The circuit according to claim 1 wherein said circuit further comprises an enable circuit having a first input coupled to a serial enable signal and a second input coupled to a parallel enable signal, said enable circuit configured to present a memory enable signal to said memory array enabling a serial or a parallel configuration.

4. The circuit according to claim 1 wherein said interface circuit further comprises:
   an address circuit configured to present an address output in response to said one or more control signals;
   a data circuit configured to present a data output in response to said one or more control signals; and
   an instruction circuit configured to present an instruction output in response to said one or more control signals.

5. The circuit according to claim 4 wherein said interface circuit further comprises:
   a plurality of select circuits each having a first input coupled to said parallel input, a second input coupled to either said address output, said data output or said instruction output and a select input for selecting between said parallel input and said address output, said data output or said instruction output.

6. The circuit according to claim 2 wherein said input of said detection circuit senses either a first voltage or a second voltage and presents said enable signal at said first state when a particular one of said configuration instructions is present and at said second state when another one of said configuration instructions is present.

7. A circuit for programming a logic device comprising:
   interface means having a first data input coupled to a serial input, a second data input coupled to a parallel input distinct from said serial input, a logic input for receiving a control signal and an interface output, said interface means for presenting output signals at said interface output from either said first data input or said second data input in response to said control signal;
   logic means having a logic output coupled to said logic input, a first input receiving a first enable signal, a second input receiving a second enable signal and an output for presenting said control signal, said logic means for presenting said control signal that is at a first state when said first enable signal is received and is at a second state when said second enable signal is received; and
   a memory array having a data input for receiving said signals from said interface output.

8. The circuit according to claim 7 wherein said circuit further comprises enable means having a first input coupled to said first enable signal, a second input coupled to said second enable signal and an enable output for presenting a memory enable signal, said enable means for presenting said memory enable signal to said memory array when either said first enable signal or said second enable signal is present.

9. The circuit according to claim 7 wherein said interface means further comprises:
- address means having an input coupled to said said serial input, an address output for presenting said input and an enable input for enabling said address means to present said address output;
- data means having an input coupled to said serial input, a data output for presenting said input and an enable input for enabling said data means to present said data output; and
- instruction means having an input coupled to said serial input, an instruction output for presenting said input and an enable input for enabling said instruction means to present said instruction output.

10. The circuit according to claim 9 wherein said interface means further comprises:
- a plurality of select circuits each having a first input coupled to said parallel input, a second input coupled to either said address output, said data output or said instruction output and a select input for selecting between one of said parallel input and said address output, said data output or said instruction output, each said plurality of said select circuits having an output for presenting either one of said plurality of inputs or said address output, said data output or said instruction output.

* * * * *